(12) United States Patent
Pinkerton et al.

(10) Patent No.: US 7,518,283 B2
(45) Date of Patent: Apr. 14, 2009

(54) NANOMETER-SCALE ELECTROSTATIC AND ELECTROMAGNETIC MOTORS AND GENERATORS

(75) Inventors: Joseph F. Pinkerton, Austin, TX (US); Jeffrey D. Mullen, New York, NY (US)

(73) Assignee: CJP IP Holdings Ltd., Austin, TX (US)

( * ) Notice: Subject to any disclaimer, the term of this patent is extended or adjusted under 35 U.S.C. 154(b) by 681 days.

(21) Appl. No.: 11/185,219

(22) Filed: Jul. 19, 2005

(65) Prior Publication Data

US 2007/0085444 A1    Apr. 19, 2007

Related U.S. Application Data

(60) Provisional application No. 60/589,417, filed on Jul. 19, 2004.

(51) Int. Cl.
  *H02N 1/00* (2006.01)
(52) U.S. Cl. .................. 310/309; 977/725; 977/762; 257/415; 310/40 MM
(58) Field of Classification Search ........... 977/725, 977/731, 762, 838; 257/415; 310/309, 40 MM
See application file for complete search history.

(56) References Cited

U.S. PATENT DOCUMENTS

| | | |
|---|---|---|
| 2,979,551 A | 4/1961 | Pack |
| 3,181,365 A | 5/1965 | Maninger |
| 3,252,013 A | 5/1966 | Stanton |
| 3,365,653 A | 1/1968 | Gabor et al. |
| 3,495,101 A | 2/1970 | Slonneger |
| 3,500,451 A | 3/1970 | Stephen |
| 3,508,089 A | 4/1970 | Cheshire |
| 3,609,593 A | 9/1971 | Boll et al. |
| 4,152,537 A | 5/1979 | Hansch |

(Continued)

FOREIGN PATENT DOCUMENTS

DE    101 23 876    11/2002

(Continued)

OTHER PUBLICATIONS

Baughman et al. "Carbon Nanotube Actuators," Science American Association for the Advancement of Science, U.S., vol. 284, May 21, 1999, pp. 1340-1344.

(Continued)

*Primary Examiner*—Karl I Tamai
(74) *Attorney, Agent, or Firm*—Kramer Levin Naftalis & Frankel LLP

(57) ABSTRACT

It is an object of the present invention to provide NEMS that utilize electrostatic and electromagnetic forces to operate. In one nanoelectrostatic embodiment, a nanometer-scale beam is suspended in an electric field. Electrically charged rails are placed around the beam. When a beam contacts a rail, the beam is forced to move through the electric field in a particular direction. In one nanoelectromagnetic embodiment, a nanometer-scale beam is suspended in a magnetic field. A rail is located in the vicinity of the beam and opposite charges are applied to the rail and beam. In this manner, a current may flow between the beam and rail when the beam and rail contact each other. This current may interact with the magnetic field to move the beam in a particular direction.

34 Claims, 6 Drawing Sheets

U.S. PATENT DOCUMENTS

| | | | |
|---|---|---|---|
| 4,387,318 A | 6/1983 | Kolm et al. | |
| 4,536,674 A | 8/1985 | Schmidt | |
| 4,595,864 A | 6/1986 | Stiefelmeyer et al. | |
| 4,814,657 A | 3/1989 | Yano et al. | |
| 4,966,649 A | 10/1990 | Harada et al. | |
| 4,979,149 A * | 12/1990 | Popovic et al. | 365/244 |
| 5,065,085 A | 11/1991 | Aspden et al. | |
| 5,132,934 A | 7/1992 | Quate et al. | |
| 5,216,631 A | 6/1993 | Sliwa, Jr. | |
| 5,233,873 A | 8/1993 | Mozgowiec et al. | |
| 5,578,976 A | 11/1996 | Yao | |
| 5,619,061 A | 4/1997 | Goldsmith et al. | |
| 5,621,258 A | 4/1997 | Stevenson | |
| 5,638,946 A | 6/1997 | Zavracky | |
| 5,649,454 A | 7/1997 | Midha et al. | |
| 5,677,823 A | 10/1997 | Smith | |
| 5,768,192 A | 6/1998 | Eitan | |
| 5,780,727 A | 7/1998 | Gimzewski et al. | |
| 5,835,477 A | 11/1998 | Binnig et al. | |
| 5,964,242 A | 10/1999 | Slocum | |
| 6,011,725 A | 1/2000 | Eitan | |
| 6,054,745 A | 4/2000 | Nakos et al. | |
| 6,069,540 A | 5/2000 | Berenz et al. | |
| 6,073,484 A | 6/2000 | Miller et al. | |
| 6,114,620 A | 9/2000 | Zuppero et al. | |
| 6,123,819 A | 9/2000 | Peeters | |
| 6,127,744 A | 10/2000 | Streeter et al. | |
| 6,127,765 A | 10/2000 | Fushinobu | |
| 6,157,042 A | 12/2000 | Dodd | |
| 6,160,230 A | 12/2000 | McMillan et al. | |
| 6,256,767 B1 | 7/2001 | Kuekes et al. | |
| 6,261,469 B1 | 7/2001 | Zakhidov et al. | |
| 6,300,756 B2 | 10/2001 | Sturm et al. | |
| 6,327,909 B1 | 12/2001 | Hung et al. | |
| 6,424,079 B1 | 7/2002 | Carroll | |
| 6,433,543 B1 | 8/2002 | Shahinpoor et al. | |
| 6,445,006 B1 | 9/2002 | Brandes et al. | |
| 6,445,109 B2 | 9/2002 | Per.cedilla.in et al. | |
| 6,509,605 B1 | 1/2003 | Smith | |
| 6,515,339 B2 | 2/2003 | Shin et al. | |
| 6,528,785 B1 | 3/2003 | Nakayama et al. | |
| 6,534,839 B1 | 3/2003 | Frazier et al. | |
| 6,548,841 B2 | 4/2003 | Frazier et al. | |
| 6,559,550 B2 | 5/2003 | Herman | |
| 6,574,130 B2 | 6/2003 | Segal et al. | |
| 6,593,666 B1 * | 7/2003 | Pinkerton | 290/1 R |
| 6,593,731 B1 | 7/2003 | Roukes et al. | |
| 6,597,048 B1 | 7/2003 | Kan | |
| 6,611,033 B2 | 8/2003 | Hsu et al. | |
| 6,643,165 B2 | 11/2003 | Segal et al. | |
| 6,653,547 B2 | 11/2003 | Akamatsu | |
| 6,669,256 B2 | 12/2003 | Nakayama et al. | |
| 6,672,925 B2 | 1/2004 | Talin et al. | |
| 6,674,932 B1 | 1/2004 | Zhang et al. | |
| 6,677,624 B2 | 1/2004 | Ihm | |
| 6,685,810 B2 | 2/2004 | Noca et al. | |
| 6,708,491 B1 | 3/2004 | Weaver et al. | |
| 6,730,370 B1 | 5/2004 | Olafsson | |
| 6,756,795 B2 | 6/2004 | Hunt et al. | |
| 6,762,116 B1 | 7/2004 | Skidmore | |
| 6,774,533 B2 | 8/2004 | Fujita et al. | |
| 6,803,840 B2 | 10/2004 | Hunt et al. | |
| 6,805,390 B2 | 10/2004 | Nakayama et al. | |
| 6,806,624 B2 | 10/2004 | Lee et al. | |
| 6,828,800 B2 | 12/2004 | Reich et al. | |
| 6,833,567 B2 | 12/2004 | Choi et al. | |
| 6,846,682 B2 | 1/2005 | Health et al. | |
| 6,848,320 B2 | 2/2005 | Miyajima et al. | |
| 6,882,051 B2 | 4/2005 | Majumdar et al. | |
| 6,905,655 B2 | 6/2005 | Gabriel et al. | |
| 6,911,682 B2 | 6/2005 | Rueckes et al. | |
| 6,914,329 B1 | 7/2005 | Lee et al. | |
| 6,953,977 B2 | 10/2005 | Mlcak et al. | |
| 6,963,117 B2 | 11/2005 | Yang et al. | |
| 7,071,023 B2 | 7/2006 | Bertin et al. | |
| 7,075,141 B2 | 7/2006 | Rueckes et al. | |
| 7,095,645 B2 * | 8/2006 | Pinkerton et al. | 365/151 |
| 7,148,579 B2 * | 12/2006 | Pinkerton et al. | 290/1 R |
| 7,196,450 B2 * | 3/2007 | Pinkerton et al. | 310/309 |
| 7,199,498 B2 * | 4/2007 | Pinkerton et al. | 310/152 |
| 7,256,063 B2 * | 8/2007 | Pinkerton et al. | 438/53 |
| 7,304,416 B2 | 12/2007 | Mullen | |
| 2002/0021860 A1 | 2/2002 | Ruan | |
| 2002/0024099 A1 | 2/2002 | Watanabe et al. | |
| 2002/0039620 A1 | 4/2002 | Shahinpoor et al. | |
| 2002/0043895 A1 | 4/2002 | Richards et al. | |
| 2002/0130353 A1 * | 9/2002 | Lieber et al. | 257/315 |
| 2002/0167374 A1 | 11/2002 | Hunt et al. | |
| 2002/0175408 A1 | 11/2002 | Majumdar et al. | |
| 2002/0180306 A1 | 12/2002 | Hunt et al. | |
| 2003/0033876 A1 | 2/2003 | Roukes et al. | |
| 2003/0036332 A1 | 2/2003 | Talin | |
| 2003/0151257 A1 | 8/2003 | Pinkerton | |
| 2003/0172726 A1 | 9/2003 | Yasutake et al. | |
| 2003/0175161 A1 | 9/2003 | Gabriel et al. | |
| 2004/0012062 A1 | 1/2004 | Miyajima et al. | |
| 2004/0157304 A1 | 8/2004 | Guo | |
| 2004/0182431 A1 | 9/2004 | Zuppero et al. | |
| 2004/0238907 A1 | 12/2004 | Pinkerton et al. | |
| 2004/0239210 A1 | 12/2004 | Pinkerton et al. | |
| 2004/0240252 A1 | 12/2004 | Pinkerton et al. | |
| 2005/0104085 A1 | 5/2005 | Pinkerton et al. | |
| 2005/0179339 A1 | 8/2005 | Pinkerton et al. | |
| 2005/0218398 A1 | 10/2005 | Bao | |
| 2005/0258717 A1 | 11/2005 | Mullen | |
| 2006/0086994 A1 | 4/2006 | Viefers et al. | |
| 2007/0018537 A1 | 1/2007 | Pinkerton et al. | |
| 2007/0085444 A1 * | 4/2007 | Pinkerton et al. | 310/309 |
| 2008/0011058 A1 | 1/2008 | Lal et al. | |

FOREIGN PATENT DOCUMENTS

| | | |
|---|---|---|
| EP | 0518283 | 12/1992 |
| EP | 0977345 | 2/2000 |
| JP | 02004516 | 1/1990 |
| JP | 3074105 | 10/2000 |
| JP | 2001-157470 | 6/2001 |
| WO | WO 00/52722 | 9/2000 |
| WO | WO 01/03208 | 1/2001 |
| WO | WO 01/20760 | 3/2001 |
| WO | WO 01/93343 | 12/2001 |
| WO | WO 02/080360 | 10/2002 |
| WO | WO 03/001657 | 1/2003 |
| WO | WO 03/021613 | 3/2003 |
| WO | WO 03/078305 | 9/2003 |

OTHER PUBLICATIONS

Cleland et al., "Fabrication of High Frequency Nanometer Scale Mechanical Resonators from Bulk Si Crystals," Appl. Phys. Lett., 69 (18), Oct. 28, 1996.

Dequesnes M et al., "Calculation of pull-in voltages for carbon-nanotube-based nanoelectromechanical switches," nanotechnology IOP publishing UK, vol. 13, Jan. 22, 2002, pp. 120-131.

Dresselhaus et al.; "Carbon Nanotubes: Synthesis, Structure, Properties, and Applications"; Springer-Verlag Berlin Heidelberg 2001; pp. 198-199, 292-293.

Halg, Beat, "On a micro-electro-mechanical nonvolatile memory cell," IEEE Trans., Electron Devices, vol. 37, No. 10 (Oct. 1990) pp. 2230-2236.

Halliday et al.; "Physics. Third Edition"; John Wiley & Sons, Inc.; 1978; pp. 529-531.

Kinaret J.M. et al. "A Carbon-Nanotube-Based Nanorelay", Applied Physics Letters, American Institute of Physics, New York, USA, vol. 8, No. 8, pp. 1287-1289, Feb. 24, 2003.

Ponomarenko et al. "Properties of boron carbide nanotubes: density-functional-based tight-binding calculations," Database Inspec Online!, Institute of Electrical Engineers, Stevenage, GB; Database accession No. 7588110, XP002278946, abstract Physical Review B (Condensed Matter and Material Physics), vol. 67, No. 12, pp. 125401-1-5, Mar. 15, 2003.

Rueckes et al., "Carbon nanotube-based nonvolatile random access memory for molecular computing," Science, vol. 289 (Jul. 7, 2000), pp. 94-97.

Sung et al. "Well-aligned carbon nitride nanotubes synthesized in anodic alumina by electron cyclotron resonance chemical vapor deposition," Applied Physics Letters, vol. 74, No. 2, pp. 197-199, Jan. 11, 1999.

Wang, Zhong Lin et al. "Piezoelectric Nanogenerators Based on Zinc Oxide Nanowire Arrays," Science Magazine—Biochemistry: Tools for New Frontiers, vol. 312, pp. 242-246, Apr. 14, 2006.

White D R et al., "The status of Johnson Noise Thermometry," Metrologia Bur. Int. Poids & Measures, France, vol. 33, 1996, pp. 325-335.

* cited by examiner

NANOMETER-SCALE ELECTROSTATIC AND ELECTROMAGNETIC MOTORS AND GENERATORS

BACKGROUND OF THE INVENTION

This application claims the benefit of U.S. Provisional Patent Application No. 60/589,417 filed on Jul. 19, 2004 and entitled "Nanometer-Scale Electrostatic and Electromagnetic Motors and Generators" (Docket No. AMB/006 PROV), which is hereby incorporated by reference herein in its entirety.

BACKGROUND OF THE INVENTION

This invention relates to nanometer-scale electromechanical systems (NEMs). In particular, the present invention relates to NEMs that may be used in various applications, such as, for example, motors, generators, pumps, fans, compressors, propulsion systems, transmitters, receivers, heat engines, heat pumps, magnetic field sensors, magnetic field generators, transistors, memory cells, inertial energy storage devices, and acoustic energy converters.

Nanometer-scale beams, such as carbon nanotubes and nanowires, can now be grown and assembled into a wide-variety of configurations. It is therefore desirable to fabricate nanometer-scale, as well as micrometer-scale, electromechanical structures that are operable to achieve a variety of useful functions.

SUMMARY OF THE INVENTION

It is an object of the present invention to provide nanometer-scale, as well as micrometer-scale, structures that may be utilized in a variety of applications. Such systems may utilize electrostatic and electromagnetic forces to realize, for example, motors, generators, pumps, fans, compressors, propulsion systems, transmitters, receivers, heat engines, heat pumps, magnetic field sensors, magnetic field generators, transistors, memory cells, inertial energy storage devices, and acoustic energy converters.

As in one nanoelectrostatic embodiment, a nanometer-scale beam is suspended in an electric field. Electrically charged rails are placed around the beam such that when the beam contacts a rail, the beam may gain a charge similar to the charge of that rail. In this manner, the electric field may interact with the beam's charge to provide an electrostatic force against the beam. If the electrostatic force is strong enough, the beam may move in a particular direction. The magnitude and polarity of the charge applied to the rails, the positioning of the rails, and the direction and strength of the electric field may be a few of the factors used in controlling the direction and magnitude of electrostatic force applied to the beam. Any rail or beam of such an embodiment may be, for example, any mechanically flexible and electrically conductive structure (e.g., a carbon nanotube or nanowire).

As in one nanoelectromagnetic embodiment, a nanometer-scale beam is suspended in a magnetic field. A rail is located in the vicinity/proximity of the beam and opposite charges are applied to the rail and beam. In this manner, a current may flow between the beam and rail when the beam and rail contact each other. This current may interact with the magnetic field to provide an electromagnetic force against the beam. If the electromagnetic force is strong enough, the beam may move in a particular direction. In controlling the direction and magnitude of such a electromagnetic force, the movement of the beam may be controlled.

A rail, or charge member, is located in the vicinity/proximity of a beam, for example, if that rail, or charge member layer, can either electrostatically manipulate the beam or is operable to come into contact with the beam.

As stated above, electrostatic and electromagnetic NEMs of the present invention may be utilized in a variety of applications. For example, charge member layers may be placed in the vicinity of a beam such that the beam may be forced to move in a clockwise, or counter-clockwise, direction. In this manner, a generator may be realized because a nanometer-scale beam spinning through a magnetic field may create a voltage when that beam contacts a nearby rail. Alternatively, a transistor may be realized because controlling the frequency that a nanometer-scale beam contacts a rail may control the amount of current transferred to that rail.

BRIEF DESCRIPTION OF THE DRAWINGS

The above and other objects and advantages of the present invention will be apparent upon consideration of the following detailed description, taken in conjunction with accompanying drawings, in which like reference characters refer to like parts throughout, and in which.

DETAILED DESCRIPTION OF THE INVENTION

Application Ser. No. 09/885,367 filed on Jun. 20, 2001 that issued as U.S. Pat. No. 6,593,666 on Jul. 15, 2003 is hereby incorporated by reference herein in its entirety.

application Ser. No. 10/453,326 filed on Jun. 2, 2003 is hereby incorporated by reference herein in its entirety.

application Ser. No. 10/453,783 filed on Jun. 2, 2003 is hereby incorporated by reference herein in its entirety.

application Ser. No. 10/453,199 filed on Jun. 2, 2003 is hereby incorporated by reference herein in its entirety.

application Ser. No. 10/453,373 filed on Jun. 2, 2003 is hereby incorporated by reference herein in its entirety.

Figure 1:
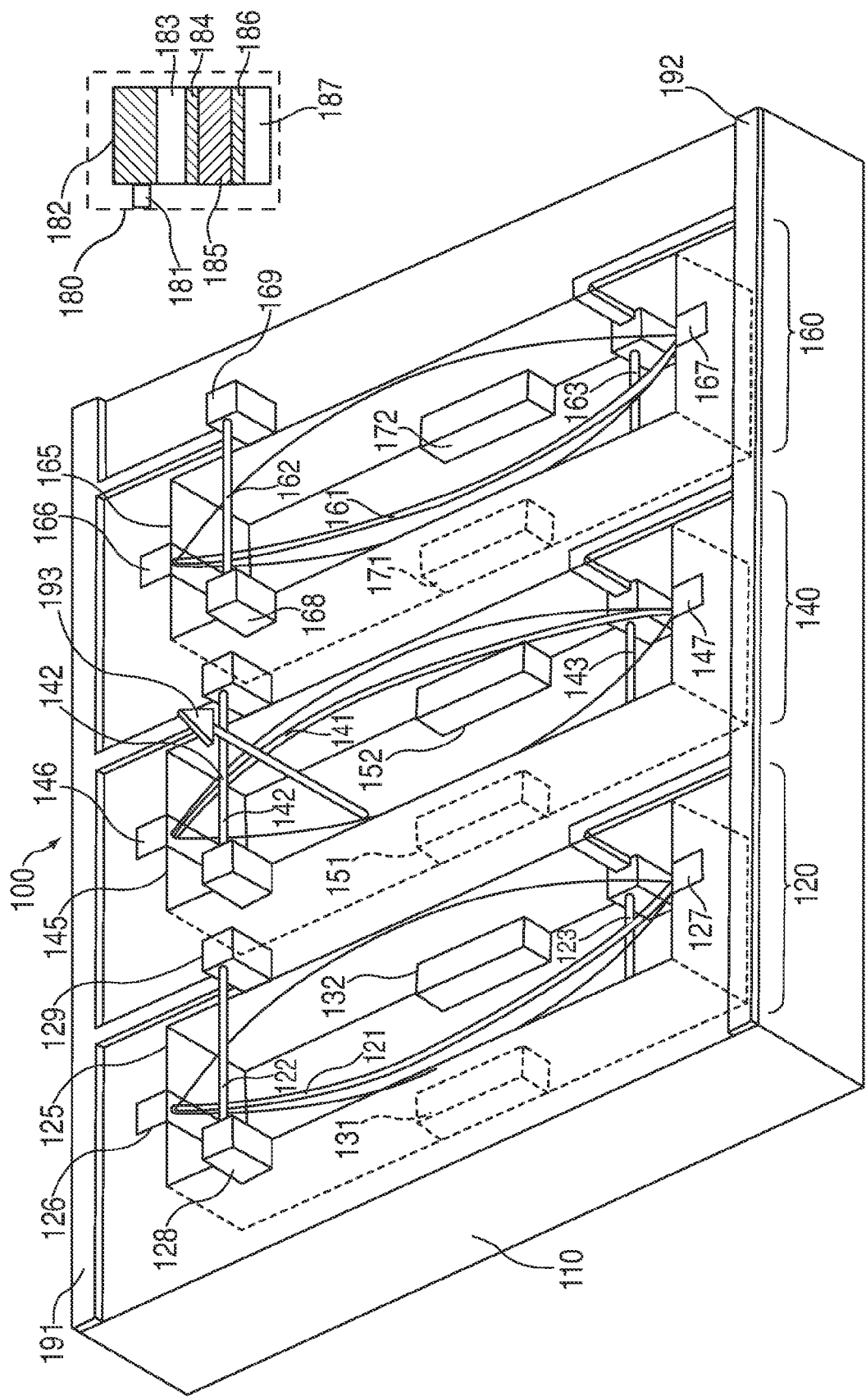
FIG. 1 is an illustration of a nanoelectrostatic system constructed in accordance with the principles of the present invention.

Turning first to FIG. 1, nanoelectrostatic system 100 is provided on substrate 110. System 100 includes nanoelectrostatic assemblies 120, 140, and 160, which may, in turn, include nanometer-scale beams 121, 141, and 161, respectively. Nanometer-scale beams 121, 141, and 161 may be, for example, any nanometer-scale mechanically flexible and electrically conducting material. In this manner, nanometer-scale beams 121, 141, and 161 may be a nanotube, nanotesttube, or nanowire.

Nanometer-scale beams 121, 141, and 161, may be provided in, or above, troughs 125, 145, and 165, respectively. Nanometer-scale beams 121, 141, and 161 may be fixed to, at each end, pillars 126 and 127, 146 and 147, and 166 and 167, respectively. The pillars of system 100 may be, for example, any portion of substrate 110 or any material fabricated on, or in, substrate 110. Slack may be provided in the suspended nanometer-scale beams such that the nanometer-scale beams may oscillate. Adjusting the amount of slack in a particular beam may adjust the amount of work needed to oscillate, or move, that beam. The amount of slack in nanometer-scale beams 121, 141, and 161 may be fabricated to be different from each other. Persons skilled in the art will appreciate that the nanometer-scale beam may still operate without slack. Moreover, a taut nanometer-scale beam may stretch as a result of, for example, oscillation such that slack is introduced into the nanometer-scale beam.

Alternatively, the slack in any nanometer-scale beam may be adjusted during operation. Adjusting the height of one of the pillars that the nanometer-scale beam is fixed to may adjust the slack of the beam. A pillar's height may be adjusted, for example, by fabricating the pillar from a piezoelectric material that expands if a voltage is applied across the material (and applying such a voltage). Changing the height of one or more pillars may also change the location of the nanometer-scale beams (or rails). Such functionality may be utilized in a variety of applications.

Particularly, an adjustable pillar is shown in pillar 180. Pillar 180 may include metal layer 182 coupled to nanometer-scale beam 181. To adjust the height of metal layer 182 from the substrate, or the height of the portion of the nanometer-scale beam coupled to metal layer 182, piezoelectric layer 185 may be provided. Piezoelectric layer 185 may be fabricated from any type of piezoceramic. Piezoelectric layer 185 may be sandwiched between metal layers 184 and 186 such that piezoelectric layer 185 mechanically distorts when a potential is provided across layers 184 and 186 (e.g., layers 184 and 186 are provided a different voltage by control circuitry).

For example, a piezoelectric layer with a width that expands and/or contracts may be utilized to change the height of pillar 180 because a change in the width of a piezoelectric layer may change the height of that piezoelectric layer. Isolation layers 183 and 187 may also be included. Persons skilled in the art will appreciate that metal layer 182 may be utilized as metal layer 184 such that isolation layer 183 and metal layer 182 are not provided in pillar 180. Furthermore, metal layer 186 may be directly connected to the substrate, or other component, such that isolation layer 187 is not provided in pillar 180.

Generally, a nanometer-scale beam is coupled to substrate 110 at two points. These two points may be, for example, the two ends of the nanometer-scale beam. Slack may be provided between these two points such that the portion between the two points (e.g., the middle portion of the nanometer-scale beam) is free-to-move. A nanometer-scale beam may be coupled to substrate 110 by, for example, either a direct connection to substrate 110, a pillar, or any other component of the nanoelectromechanical system.

Assemblies 120, 140, and 160 may also include rails 122 and 123, 142 and 143, and 162 and 163 which may, in turn, be placed in the vicinity of nanometer-scale beams 121, 141, and 161, respectively. For example, rails 122 and 123 may be placed perpendicular to nanometer-scale beam 121.

To induce motion in nanometer-scale beam 121, opposite charges may be applied to rails 122 and 123. In an embodiment where a positive charge is applied to rail 123, nanometer-scale beam 121 may contact positive rail 123 and gain a positive charge. The positive charge gained by nanometer-scale beam 121 may then electrostatically interact with electric field 193 such that nanometer-scale beam 121 may be forced to move vertically up toward rail 122. In addition to the electrostatic force applied to nanometer-scale beam 121 by electric field 193, a positively charged nanometer-scale beam 121 may be repelled from positively charged rail 123 (charges with the same polarity repel) and attracted to negatively charged rail 122 (charges with opposite polarities attract).

Persons skilled in the art will appreciate that layer 126 and/or layer 127 may be coupled to, for example, a driving, starting, or sensing circuit (not shown). Such a starting circuit may, for example, provide an initial charge on nanometer-scale beam 121 such that nanometer-scale beam 121 is initially influenced to contact beam 122 or beam 123. Once an initial contact occurs, charges supplied to rails 122 and 123 (or charge member layers 131 and 132) may continue influencing the movement of nanometer-scale beam 121. Persons skilled in the art will also appreciate that the Brownian movement of the molecules of any working fluid that system 100 is immersed in (or the thermal vibrations of nanometer-scale beam 121) may randomly cause nanometer-scale beam 121 to contact, or electrically couple to, rails 122 or 123. In this manner, a charge does not have to be initially supplied to layer 126 and/or 127 for system 100 to operate.

If the electrostatic force against nanometer-scale beam 121 is strong enough, nanometer-scale beam 121 may contact negatively charged rail 122 and take on a negative charge. This negative charge on nanometer-scale beam 121 may then electrostatically interact with electric field 193 such that nanometer-scale beam 121 is forced vertically down toward rail 123. In addition to the electrostatic force applied to nanometer-scale beam 121 by electric field 193, a negatively charged nanometer-scale beam 121 may be repelled from negatively charged rail 122 and attracted to positively charged rail 123.

If the electrostatic force against nanometer-scale beam 121 is strong enough, nanometer-scale beam 121 may contact positively charged rail 123 and take on a positive charge. In this manner, the functionality of nanometer-scale beam moving continuously between rails 122 and 123 may be realized. In other words, nanometer-scale beam 121 may be forced to vertically vibrate up and down like, for example, a plucked guitar string.

Persons skilled in the art will appreciate that the first beam/rail contact may occur autonomously because of gravity or the random vibration of substrate 110. Alternatively, the first beam/rail contact may occur as the result of, for example, applying particular voltages to a rail, beam, or charge member layer of system 100.

Rails of the present invention may be fabricated from, for example, any mechanically flexible and electrically conductive material. In this manner, rails may be fabricated from a nanotube, nanotest-tube, or nanowire. Furthermore, rails of the present invention may be fixed to substrate 100 so that they are rigid. Alternatively, a rail may be provided without slack. For example, rail 122 may be suspended between pillars 128 and 129 without slack, or fixed to substrate 110, such that rail 122 does not substantially vibrate when contacted by nanometer-scale beam 121. As a result, less wear may occur to a nanometer-scale rail (or pillars 128 and 129) if, for example, that nanometer-scale rail was not fabricated from a perfect molecule (e.g., a carbon nanotube).

Assemblies 120, 140, and 160 may include charge member layers 131 and 132, 151 and 152, and 171 and 172, respectively. Such charge member layers may be included to manipulate the manner in which the nanometer-scale beams of system 100 move through electric field 193. For example, charge members 131 and 132 may be provided in the vicinity, and on different sides, of nanometer-scale beam 121. Charge member layers 131 and 132 may be provided with different polarities of charge such that nanometer-scale beam 121 is forced to rotate in a clockwise or counter-clockwise direction.

As in one example, suppose that rail 123 is positive and rail 122 is negative. Now, suppose that charge member layer 131 is provided a positive charge while charge member layer 132 is provided a negative charge. As a result, nanometer-scale beam 121 may rotate in a counter-clockwise direction.

Particularly, nanometer-scale beam 121 may gain a positive charge when nanometer-scale beam 121 contacts rail 123. Electric field 193 may interact with the positive charge on nanometer-scale beam 121 and force nanometer-scale beam 121 to move up toward rail 122. Yet, nanometer-scale beam 121 will also be attracted toward charge member layer 132 due to the opposite charge (i.e., negative charge) of charge member layer 132 and the similar charge (i.e., positive charge) of charge member layer 131. Once nanometer-scale beam 121 contacts rail 122, nanometer-scale beam 121 may gain a negative charge. Electric field 193 may interact with the negative charge on nanometer-scale beam 121 and force nanometer-scale beam 121 to move down toward rail 123. Yet, nanometer-scale beam 121 may also be attracted toward charge member layer 131 due to the opposite charge (i.e., positive charge) of charge member layer 131 and the similar charge (i.e., negative charge) of charge member layer 132. In this manner, charge member layer 121 may rotate in a counter-clockwise direction.

Persons skilled in the art will appreciate that a constant charge on charge member layers 131 and 132 may not move nanometer-scale beam 221 in a clock-wise or counter-clockwise direction. Therefore, control and driver circuitry (not shown) may be included to change the charges supplied to charge member layers 131 and 132 at any given time. For example, nanometer-scale beam 121 may contact a positively charged rail 123 and may be forced up toward rail 122 by electric field 193. If charge member layer 132 is negatively charged then nanometer-scale beam 121 may be attracted toward nanometer-scale beam 132. The polarity of charge on nanometer-scale beam 132 may be changed to a positive polarity between the time that nanometer-scale beam 121 contacts rails 122 and 123. When the polarity of rail 132 is changed to a positive polarity, then nanometer-scale beam 121 may be repelled from charge member layer 132. In this manner a more circular movement of nanometer-scale beam 121 may be provided. The polarity of charge member layer 131 may also be switched in synchronization with the switching of the polarity of charge member layer 132.

Persons skilled in the art will appreciate that additional charge member layers may be provided in the vicinity of nanometer-scale beam 121 such that nanometer-scale beam 121 may move in a variety of directions. Charges applied to such charge member layers (or the rails or electric fields of system 100) may also be controlled such that the movement of nanometer-scale beam 121 is also controlled.

The frequency at which nanometer-scale beam 121 rotates may depend on a variety of factors. For example, changing the magnitudes of the charges applied to rails 122 and 123 may change the frequency of rotation. Additionally, changing the magnitudes of charges applied to charge member layers 131 and 132 may change the frequency of rotation. Alternatively, the heights of rails 122 and 123 may be changed such that rails 122 and 123 are spaced closer together. Charge member layers of system 100 may also be placed on pillars which, in turn, may also be adjusted during the operation of system 100.

Pillars 128 and/or 129 may be conductive such that pillars 128 and/or 129 may provide an electrical charge to rail 122. In this manner, rail 122 may be electrically coupled to common node 191 through pillars 128 and/or 129. Alternatively, only a portion of a pillar may be conductive or coupled to common node 191.

In system 100, rails 122, 142, and 162 are coupled together through common node 191 and rails 123, 143, and 163 are coupled together through common node 192. The rails of system 100, however, do not have to be coupled together and may be supplied with a different amount (or polarity) of electrical charge. Additional common nodes may be provided to electrically couple, for example, any number of rails, charge member layers, or nanometer-scale beams in any type of configuration.

As previously mentioned, system 100 is preferably immersed in electric field 193. Assemblies 120, 140, and 160, however, may each be immersed in a separate electric field. The characteristics (e.g., magnitude, polarity, or direction) of each of these magnetic fields may be manipulated in order to realize a variety of applications. For example, assembly 160 may be provided with a stronger electric field than assembly 140. As a result, nanometer-scale beam 161 may spin/displace at a higher frequency than assembly 140 or may be provided with more force in a particular direction. Doing so may realize a system capable of being utilized in a variety of applications. For example, if substrate 110 is placed in a working fluid and nanometer-scale beam 161 rotates faster than nanometer-scale beam 141, then substrate 110 may rotate.

Electric field 193 may be provided, for example, by placing substrate 110 between two plates of a capacitor (not shown). The polarity, magnitude, or direction of electric field 193 may be controlled (e.g., changed) such that system 100 may be utilized in a variety of applications. The direction of electric field 193 may be changed, for example, if electric field 193 is generated from two capacitor plates and the locations of these capacitor plates are manipulated. The polarity and magnitude of electric field 193 may be changed, for example, if electric field 193 is generated from two capacitor plates and the voltages supplied to these capacitor plates are manipulated. Electric charges may be provided to the rails, charge member layers, and nanometer-scale beams of system 100 by, for example, one or more voltage sources.

Persons skilled in the art will appreciate that numerous alternate embodiments of system 100, or any other structure described herein, may be constructed in accordance with the principles of the present invention. For example, nanometer-scale rails 122, 142, and 162 may be a single nanotube situated between pillars 128 and 169. Furthermore, more than two rails, or charge member layers, may be provided around nanometer-scale beam 121. Such rails, or charge member layers, may be provided in configurations other than being, for example, perpendicular, or parallel, to nanometer-scale beam 121, but may be provided in any location with respect to nanometer-scale beam 121.

System 100 may be utilized in a variety of applications. For example, system 100 may be provided in a working fluid and utilized as a nanoelectrostatic propulsion system. In this manner, the moving nanometer-scale beams may be used to, for example, propel substrate 110. As in another example, system 100 may be provided in a working fluid and utilized as a nanoelectrostatic pump. In this manner, the moving nanometer-scale beams may be used to, for example, propel the working fluid in a particular direction.

As in another example, system 100 may be utilized as three transistors in a parallel configuration. Increasing the magnitude of an external electric field across nanometer-scale beams 121, 141, and 161 may increase the rotational frequency of the nanometer-scale beams. Thus, the charge per unit of time (e.g., current per unit of time) that is transferred to a rail may be increased. Decreasing the magnitude of the external field may, in turn, decrease the charge per unit of time (e.g., current per unit of time) that is transferred to a rail.

Figure 2:
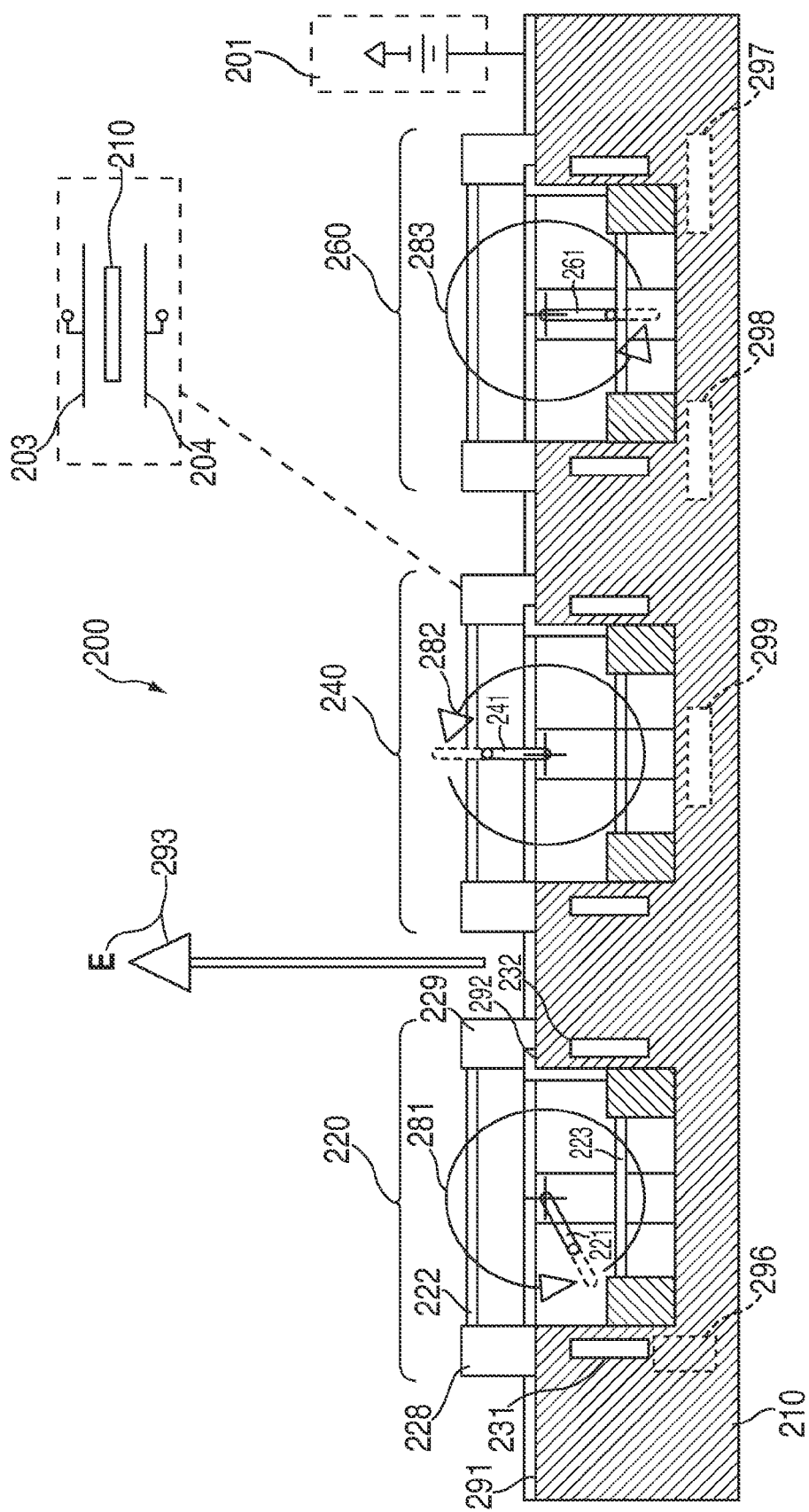
FIG. 2 is an illustration of a cross-sectional view of a nanoelectrostatic system constructed in accordance with the principles of the present invention.

Turning next to FIG. 2, system 200 is shown which is a cross-sectional section of a nanoelectrostatic system that is fabricated on substrate 210. Electric field 293 is provided in system 200. Particularly, substrate 210 may be provided between capacitor plates 203 and 204 to realize electric field 293. Alternatively, any type of electric field generator may be provided to realize electric field 293.

System 200 includes assemblies 220, 240, and 260 which, in turn, may include nanometer-scale beams 221, 241, and 261, respectively. Nanometer-scale beams 221, 241, and 261 may be manipulated to move in a particular manner similar to nanometer-scale beams 121, 141, and 161 of FIG. 1. For example, rails 222 and 223 may provide nanometer-scale beam 221 with charges that interact with electric field 293 in order to force nanometer-scale beam 221 to move. Charge member layers 231 and 232 may also be provided in order to electrostatically manipulate the location, or movement, of nanometer-scale beam 221. A voltage source, such as voltage source 201, may be coupled to any rail, nanometer-scale beam, or charge member layer of system 200. By manipulating the characteristics of the charges on, or locations of, rails 222 and 223 and charge member layers 231 and 232, nanometer-scale beam 221 may be influenced to move in a variety of different ways.

For example, placing rails 222 and 223 vertically on different sides of, and perpendicular to, nanometer-scale beam 221 may allow nanometer-scale beam 221 to vibrate between rails 222 and 223 on a horizontal plane. For example, providing electric field 293 from left to right in FIG. 2, and applying the appropriate polarities of charge to rails 222 and 223, nanometer-scale beam 221 may fluctuate horizontally. Manipulating nanometer-scale beam 221 to move horizontally may be advantageous in particular applications. For example, the impact of gravity on a horizontally-moving nanometer-scale beam 221 may be the same no matter what direction (left or right) nanometer-scale beam 221 is moving in (assuming gravity is a vertical force in system 200).

Charge member layers 231 and 232 may be included in system 200 to, for example, influence the motion, or location, of nanometer-scale beam 221. For example, charge member layers 231 and 232 may be provided in substrate 210. To illustrate the potential influential characteristics of charge member layers 231 and 232, suppose that nanometer-scale beam 221 is vertically fluctuating between negatively charged rail 222 and positively charged rail 223. Next, suppose that charge member layer 232 is negatively charged and charge member layer 231 is positively charged. As a result of the electrostatic forces provided by charge member layers 231 and 232, nanometer-scale beam 221 may rotate in counter-clockwise direction 281. Providing a negative charge to charge member layer 231 and a positive charge member layer 232 may, for example, force nanometer-scale beam 221 to rotate in a clockwise direction (a direction opposite that of direction 281). Control circuitry (not shown) may be included to control the polarity or magnitude of charge applied to a particular charge layer.

Persons skilled in the art will appreciate that charge member layers 231 and 232 may be offset from one another. For example, charge member layer 231 may be provided at location 296. Alternatively, a second charge member layer (not shown) may be provided at location 296 or charge member layer 231 may extend down into position 296 so that charge member layer 231 is larger than charge member layer 232.

Additional charge member layers may be located anywhere in system 200 to influence the movement, or location, of a nanometer-scale beam. For example, charge member layer 299 may be provided directly beneath nanometer-scale beam 241. As per another example, charge member layers 298 and 297 may be provided beneath, but offset from, nanometer-scale beam 261. Depending on the polarity of charge provided to the charge member layers of system 200, nanometer-scale beam may be influenced to move in a particular direction or stay in a particular position.

Assemblies 220, 240, and 260 may be configured such that nanometer-scale beams 221, 241, and 261 move in synchronization with one another. For example, nanometer-scale beams 221, 241, and 261 may rotate in counterclockwise direction 281, 282, and 283, respectively, at the same frequency and in the same phase. In this manner, assemblies 220, 240, and 260 may be provided the same control signals (e.g., the charges provided to the charge member layers and/or rails).

Alternatively, assemblies 220, 240, and 260 may be configured such that nanometer-scale beams 221, 241, and 261 move independently from one another. For example, nanometer-scale beams 221, 241, and 261 may be provided different control signals. In this manner, assembly 240 may be configured to rotate clockwise while assemblies 220 rotates counter-clockwise and 260 does not rotate at all. Control and driver circuitry (not shown) may be included in order to provide assemblies 220, 240, and 260 with different control signals (e.g., charges).

A charge (e.g., a voltage) may be directly provided to the nanometer-scale beams of system 200. Doing so may allow the rails of system 200 to be removed. For example, the nanometer-scale beams may directly be provided a voltage of a particular polarity and magnitude. Depending on the magnitude and polarity of such a voltage, the nanometer-scale beams may move in a particular direction, and at a particular speed, within electric field 293. Charge member layers may be provided to control the movement of such nanometer-scale beams. Alternatively, including charge member layers in system 200 may allow for systems without electric field 293. For example, if charge member layer 299 is provided a negative charge while nanometer-scale beam 241 is directly provided a positive charge then the electrostatic interaction among these two forces will influence the motion, or location, of nanometer-scale beam 241.

System 200 may, for example, be utilized as an array of nanoelectromechanical memory cells (e.g., nanoelectrostatic memory cells) because the nanometer-scale beams may easily be suspended in a particular position. Each position may be associated with a state of memory. Reading the location of a nanometer-scale beam may be sensed by applying a particular voltage to a charge member layer or rail and determining the time it takes the nanometer-scale beam to electrically couple a charge member layer or rail.

The assemblies of system 200 may also be utilized as transistors. As in one embodiment, the contact rate that occurs between a nanometer-scale beam and a contact (e.g., a rail or charge member layer) may be sensed by sensing circuitry (not shown). For example, the nanometer-scale beam may be coupled to a node. Every time the nanometer-scale beam contacts a charged rail, an amount of current may flow through this node. Thus, increasing the magnitude of electric field 293, for example, may increase the contact frequency of the nanometer-scale beam (thereby increasing the current that flows through the node). Persons skilled in the art will appreciate that system 200 may be utilized as a transistor without, for example, continuously providing a charge to a nanometer-scale beam. In this manner, a nanometer-scale beam may gain a charge every time the nanometer-scale beam contacts a rail that is charged. If the nanometer-scale beam is already charged when the nanometer-scale beam contacts a rail, then an amount of current may be supplied to the rail. The larger the frequency that a nanometer-scale beam contacts a rail, the larger the average current that may be obtained from that rail during a particular unit of time. Changing control signals (e.g., changing the magnitude of electric field 293) may change the frequency that the nanometer-scale beam contacts a rail. In turn, changing such control signals may change the average amount of current transmitted between the rails. In this manner, a transistor may be provided.

Figure 3:
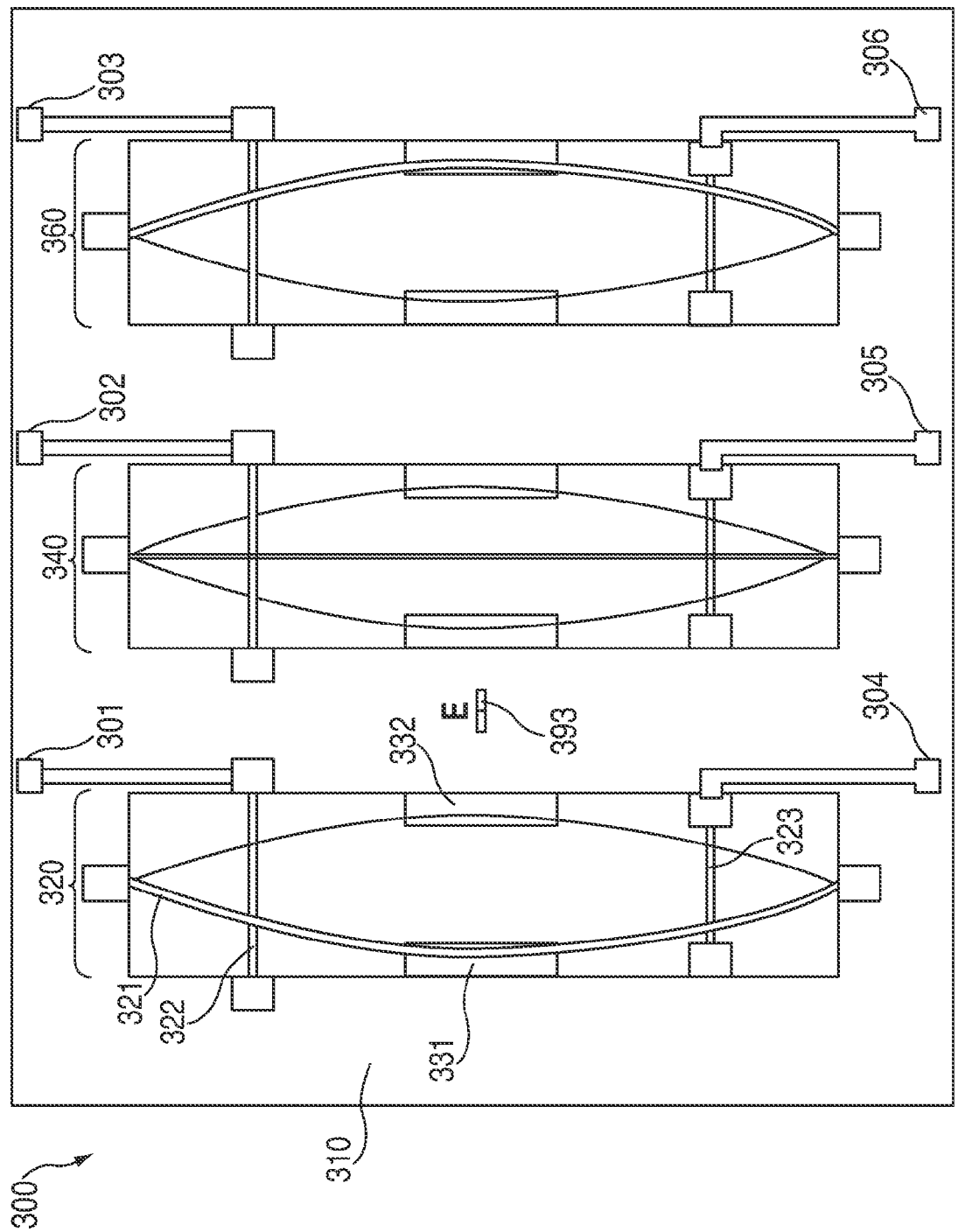
FIG. 3 is an illustration of a top-view of a nanoelectrostatic system constructed in accordance with the principles of the present invention.

Turning next to system 300 of FIG. 3, a birds-eye's perspective of a nanoelectrostatic system constructed in accordance with the principles of the present invention is provided. System 300 includes assemblies 320, 340, and 360 which may include separate control nodes 301, 302, 303 and 304, 305, 306, respectively such that assemblies 320, 340, and 360 may be operated independent of one another. For example, control node 304 may be coupled to rail 323 and control node 301 may be provided to rail 322 in order to manipulate nanometer-scale beam 321 independent of the nanometer-scale beams of assemblies 340 and 360.

As discussed above, charge member layers may be provided in a variety of locations. In this manner, charge member layers 331 and 332 may be provided beneath nanometer-scale beam 321 on substrate 310. Charge member layers 331 and 332 may also be provided on different sides of nanometer-scale beam 321 in locations that allow nanometer-scale beam 321 to rotate over charge member layers 331 and 332. Persons skilled in the art will appreciate that changing the amount of slack in a nanometer-scale beam may change the locations that the nanometer-scale beam may rotate above (or below).

Figure 4:
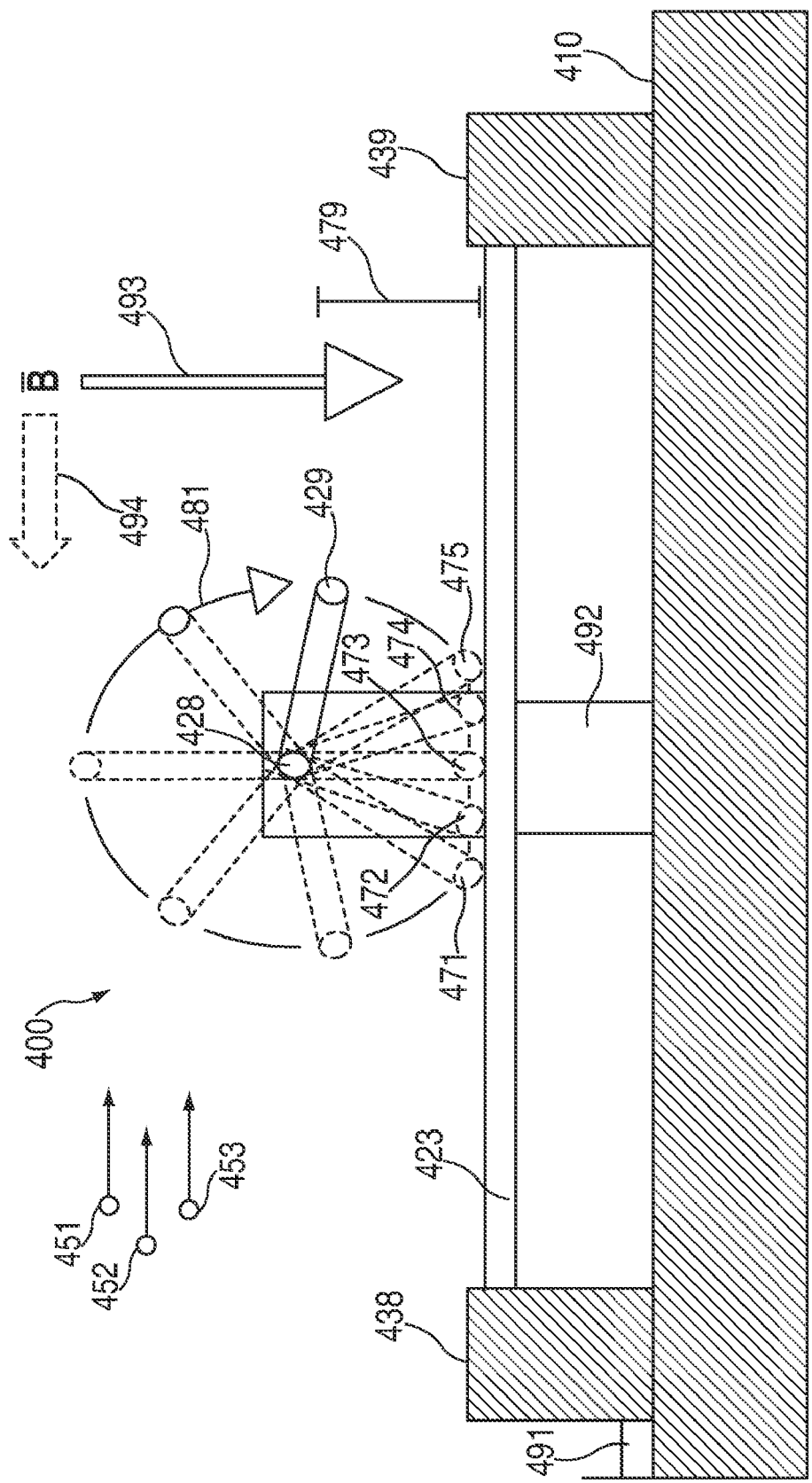
FIG. 4 is an illustration of a cross-sectional view of a nanoelectromagnetic system constructed in accordance with the principles of the present invention.

FIG. 4 shows nanoelectromagnetic system 400 that includes nanometer-scale beam 421, rail 423, and magnetic field 493. System 400 may allow nanometer-scale beam 421 to rotate with only a single rail. Persons skilled in the art, however, will appreciate that additional rails, or charge member layers, may be included in system 400 in order to influence the movement, or location, of nanometer-scale beam 421.

System 400 may operate as follows. A positive voltage may be applied to nanometer-scale beam 421. A conductive node (e.g., a metal layer) may be coupled to nanometer-scale beam 421 such that nanometer-scale beam 421 may be provided a voltage. In this manner, pillar 492 may be conductive and coupled to a voltage source. In order to electromagnetically influence nanometer-scale beam 421 to move, rail 423 may be provided a negative voltage (e.g., a voltage having a polarity opposite that of nanometer-scale beam 421). As a result, a current may flow from nanometer-scale beam 421 to rail 423 when nanometer-scale beam 421 and rail 423 come into contact with one another. This current may interact with magnetic field 493 to create a force against nanometer-scale beam 421. For example, nanometer-scale beam 421 may be forced to move in direction 481 (or a direction opposite to direction 481 depending on the direction of current flow). If rail 423 is provided a positive voltage and nanometer-scale beam 421 is provided a negative voltage then nanometer-scale beam 421 may, for example, rotate in a counter-clockwise, or possibly a clockwise, direction (depending on the direction of current flow). Charge member layers (not shown) may also be included to influence the movement, or location, of nanometer-scale beam 421. Additionally, the direction, or magnitude, of magnetic field 493 may be changed such that system 400 may be utilized in a variety of applications.

Persons skilled in the art will appreciate that system 400 may be utilized as a generator. For example, if nanometer-scale beam 421 is spinning in a clockwise manner (e.g., direction 481), and neither rail 423 or nanometer-scale beam 421 is supplied a voltage, then nanometer-scale beam 421 may create a voltage that appears along the length of nanometer-scale beam 421. The voltage may be created as a result of conductive nanometer-scale beam 421 cutting through magnetic field 493 and contacting rail 423. Such a voltage may take the form of a pulsed DC voltage that occurs once per revolution of nanometer-scale beam 421. Additional rails may be included in order to increase the frequency of the voltage pulse. Alternatively, influencing nanometer-scale beam 421 to rotate faster may increase the frequency of the pulsed DC voltage. For example, system 400 may be provided in a working fluid (e.g., a liquid, plasma, or gas) with molecules 451, 452, and 453 moving in one, or more, directions that influence nanometer-scale beam 421 to rotate in a particular direction. In this manner, a working fluid may be pumped through system 400 in a particular direction. Doing so may utilize system 400 as a kinetic/thermal energy to electrical energy converter.

If nanometer-scale beam 421 is embodied as a nanotube then sunlight (or an artificial light), for example, may also influence nanometer-scale beam 421 to oscillate. Thus, switching the direction that sunlight hits nanometer-scale beam 421 may allow nanometer-scale beam 421 to rotate/vibrate in a particular direction/manner (e.g., direction 481). Doing so may utilize system 400 as a mechanical solar cell.

System 400 may be utilized as an energy storage device. For example, electrical energy may be put into system 400 by providing the appropriate voltages to rail 423 and nanometer-scale beam 421. As a result, the electrical energy may be converted into kinetic energy in the form of a spinning nanometer-scale beam 421. When the electrical energy is needed again, the kinetic energy of the spinning nanometer-scale beam 421 may be converted back into electrical energy as described above. Multiple configurations allow for the storage of kinetic energy without simultaneous conversion into electrical energy. For example, rail 423 may be physically moved away from nanometer-scale beam 421 such that rail 423 and nanometer-scale beam 421 do not couple one another. A charge member layer having, for example, a charge with an opposite polarity of the charge on rail 423 may electrostatically move rail 423 away from nanometer-scale beam 421. As per another embodiment, magnetic field 493 and the voltages applied to nanometer-scale beam 421 and rail 423 may be turned OFF. As per yet another embodiment, the height of pillars 439 and 438 may be adjusted (by, for example, fabricating the pillars from a piezoelectric material) to determine the instances when nanometer-scale beam 421 may contact rail 423.

More than one system 400 may be coupled in parallel in order to, for example, increase the power output of the system or smooth the pulsed DC output. The DC output may be smoothed because the electrical coupling of the nanometer-scale beams and rails of multiple systems 400 may occur at different times.

More than one nanometer-scale beam 421 may be provided to rotate about and electrically couple rail 423. For example, several nanometer scale beams 421 may be coupled to the same node and configured to electrically couple rail 423. Persons skilled in the art will appreciate that the power density of a power generating system 400 may be large. For example, rotating nanotubes may have a large "tip speed" and excellent electrical conduction characteristics. Such characteristics may increase the power density of system 400.

Magnetic field 493 may be provided by a magnetic field generator (not shown) such as, for example, one or more electromagnets. Magnetic field 493 may be provided with a variety of different magnitudes and in a variety of different directions in order to be utilized in a variety of applications. Similarly, the direction and/or magnitude of magnetic field 493 may be varied (e.g., controlled by control circuitry) in order to be utilized in a variety of applications. For example, pointing magnetic field 493 in direction 494 may cause nanometer-scale beam 421 to vibrate vertically instead of rotate.

Figure 5:
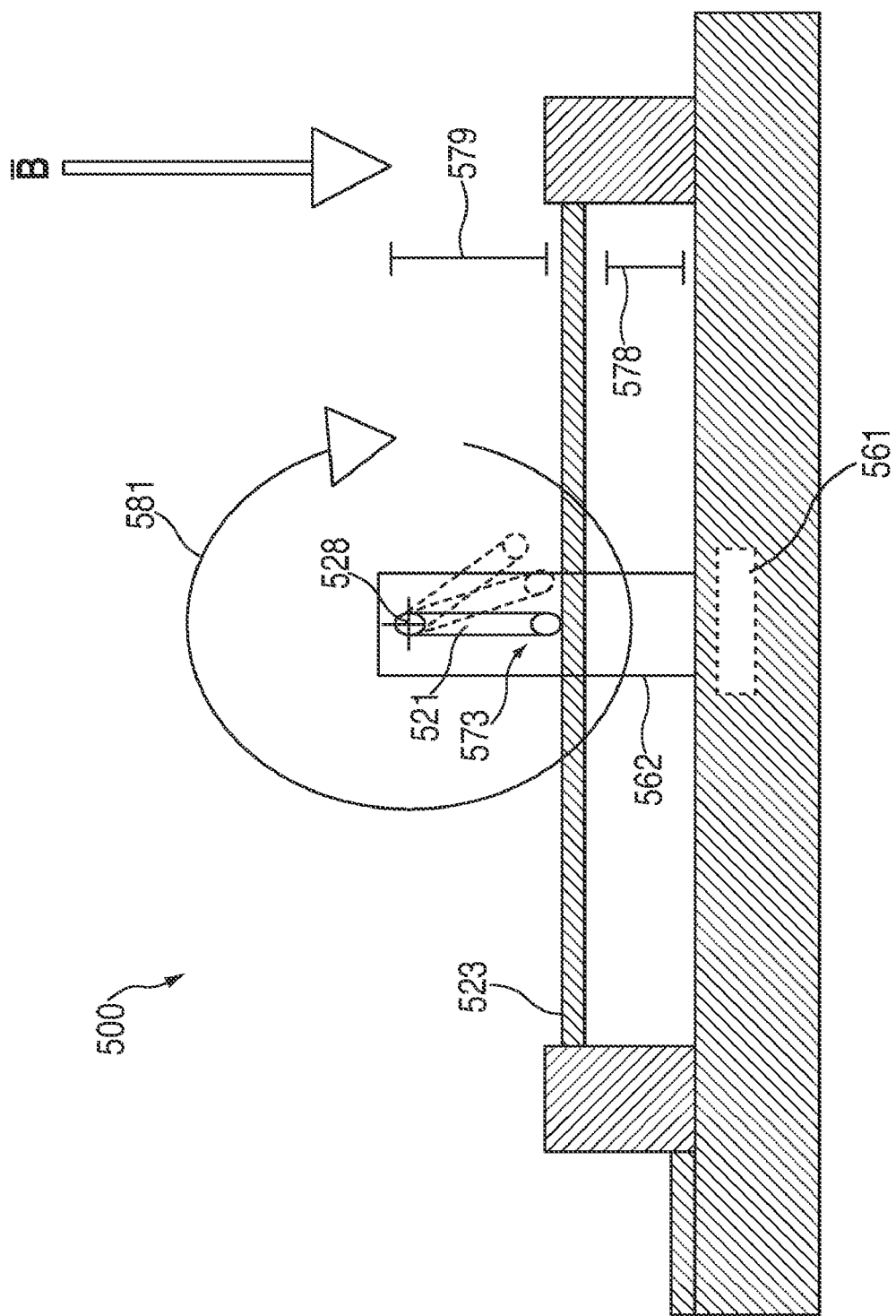
FIG. 5 is an illustration of a cross-sectional view of another nanoelectromagnetic system constructed in accordance with the principles of the present invention.

Nanometer-scale beam 421 may be provided as a whip (where portion 429 is the end surface of nanometer-scale beam 421) or as a jump-rode (where the end of nanometer-scale beam 421 opposite the one fixed to pillar 492 is also fixed). The distance of rail 423 from nanometer-scale beam pivot 428, and the amount of slack in nanometer-scale beam 421, may, for example, affect the operation of system 400 as shown in system 500 of FIG. 5.

System 500 includes nanometer-scale beam 521 pivoted at point 528. Point 528 is further from rail 523 than point 428 of FIG. 4. is from rail 423 of FIG. 4. Particularly, distance 579 is greater than distance 479 of FIG. 4. As a result, nanometer-scale beam 521 may electrically couple rail 523 for a smaller amount of time than nanometer-scale beam 421 of FIG. 4 may electrically couple rail 423 of FIG. 4. To illustrate this point, nanometer-scale beam 521 may only contact rail 523 at position 573. Nanometer-scale beam 421 of FIG. 4, however, may contact rail 423 of FIG. 4 at positions 471, 472, 473, 474, and 475. The longer that a nanometer-scale beam may contact a rail, for example, the more average force may be applied to the nanometer-scale beam. Alternatively, the longer that a nanometer-scale beam may contact a rail, for example, the more power may be provided by the nanometer-scale beam.

Changing distance 579 may be accomplished in a variety of ways. The height of pillar 562, for example, may be increased. Alternatively, pivot 528 may be raised on pillar 562. As in another embodiment, rail 523 may be lowered (e.g., distance 578 may be manipulated). As discussed above, the slack of nanometer-scale beam 521, if embodied as a jump-rope, may be manipulated to also change the amount of time, or the number of locations, in which nanometer-scale beam 521 contacts one or more rails or charge member layers. In yet another embodiment, charge member layer 561 may be provided to physically distort the location of rail 523 such that, for example, nanometer-scale beam 521 may not contact rail 523. In such an embodiment, the polarity of charge provided to charge member layer 561 may be opposite to the polarity of charge provided to rail 523.

Figure 6:
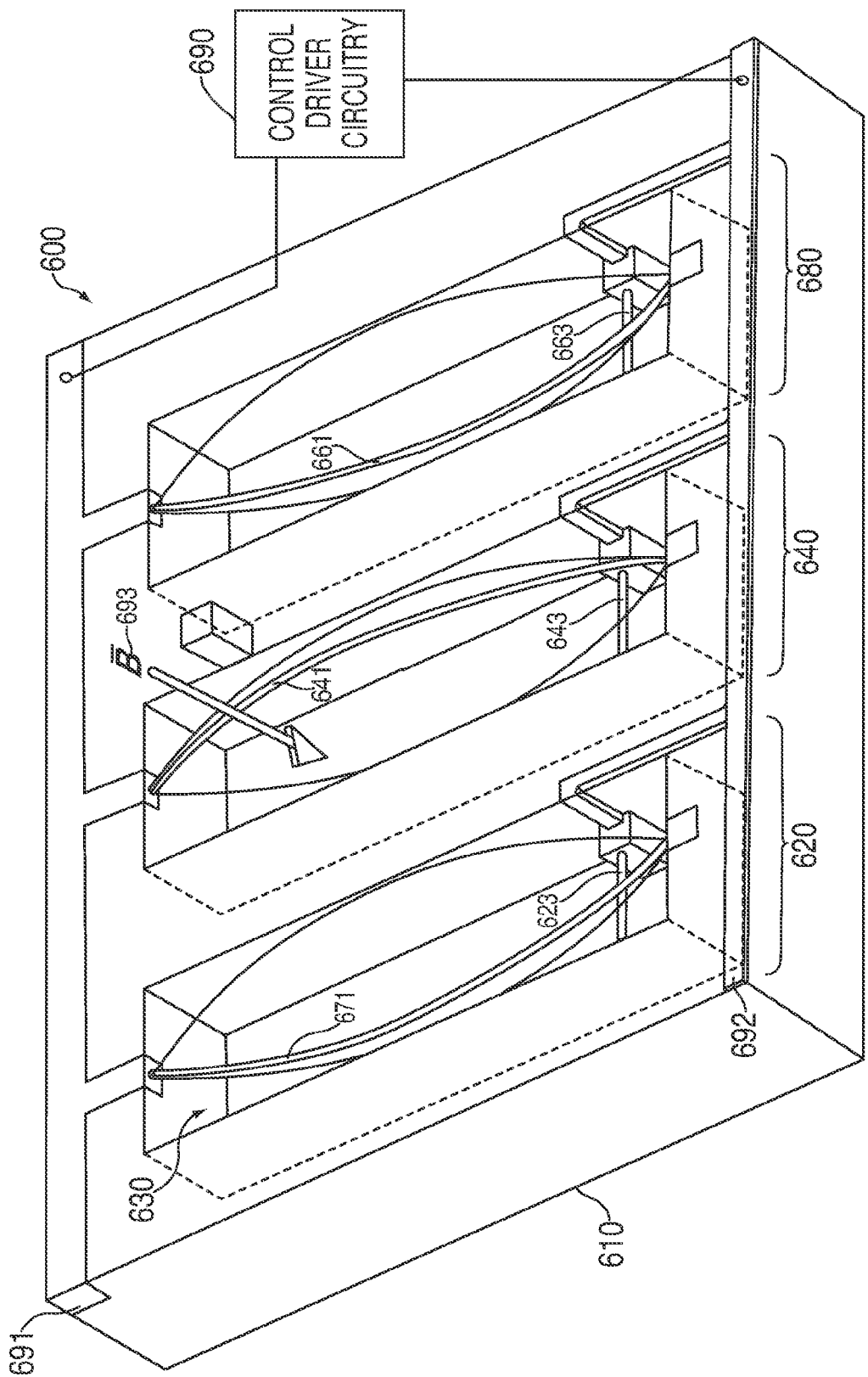
FIG. 6 is an illustration of a nanoelectromagnetic system constructed in accordance with the principles of the present invention.

Pillar 562 may also be embodied as a portion of a trough as shown in system 600 of FIG. 6. As shown in assembly 620, nanometer-scale beam 621 may be coupled to a portion of substrate 610 that defines trough 630.

As shown in system 600, assemblies 620, 640, and 660 may be included with nanometer-scale beams 621, 641, and 661, respectively, that may be coupled together at node 691. Additionally, rails 623, 643, and 663 may be coupled together at node 692. The magnitude and polarity of voltages and/or currents supplied to system 600 may be provided by one or more control/driver circuits 690. The amount of magnetic field 693 may also be provided and controlled by circuit 690 or an additional control/driver circuit (not shown).

From the foregoing description, persons skilled in the art will recognize that this invention provides nanometer-scale electromechanical assemblies and systems that may be used as transistors, amplifiers, memory cells, automatic switches, diodes, variable resistors, magnetic field sensors, temperature sensors, electric field sensors, and logic components. In addition, persons skilled in the art will appreciate that the various configurations described herein may be combined without departing from the present invention. For example, an electric field may also be provided in system 600 of FIG. 6. It will also be recognized that the invention may take many forms other than those disclosed in this specification. Accordingly, it is emphasized that the invention is not limited to the disclosed methods, systems and apparatuses, but is intended to include variations to and modifications therefrom which are within the spirit of the following claims.

What is claimed is:

1. A nanoelectromechanical system comprising:
    a substrate;
    a first pillar coupled to said substrate;
    a second pillar coupled to said substrate;
    a nanometer-scale beam suspended between said first and second pillars, wherein slack is provided in said beam between said first and second pillars;
    a first rail located within the vicinity of said beam, wherein said beam is operable to contact said first rail;
    a second rail located within the vicinity of said beam, wherein said beam is operable to contact said second rail; and
    an electric field generator for providing an electric field to said beam, wherein said electric field generator is a capacitor having at least two capacitor plates, and wherein said substrate is located between at least two of said at least two capacitor plates.

2. The nanoelectromechanical system of claim 1, wherein said first rail is located substantially perpendicular to said beam.

3. The nanoelectromechanical system of claim 2, wherein said second rail is provided substantially perpendicular to said beam.

4. The nanoelectromechanical system of claim 3, wherein said first and second rails are located on substantially opposite sides of said beam.

5. The nanoelectromechanical system of claim 4, wherein said first rail is located between said beam and said substrate and said second rail is located above said beam.

6. The nanoelectromechanical system of claim 1, wherein said beam is a carbon nanotube.

7. The nanoelectromechanical system of claim 1, wherein said first rail is a carbon nanotube.

8. The nanoelectromechanical system of claim 1, wherein said second rail is a carbon nanotube.

9. The nanoelectromechanical system of claim 1, wherein at least a portion of said beam is provided above a trough.

10. The nanoelectromechanical system of claim 1 wherein at least a portion of said beam is provided in a trough.

11. The nanoelectromechanical system of claim 1, wherein said beam is not permanently coupled to a conductive material.

12. The nanoelectromechanical system of claim 1, wherein a first charge is provided to said first rail, a second charge is provided to said second rail, and said first and second charges have opposite polarities.

13. The nanoelectromechanical system of claim 12, wherein said first charge is positive, said second charge is negative, said beam is forced to move toward said second rail by said electric field when said beam is positively charged.

14. The nanoelectromechanical system of claim 1, further comprising a first charge member layer located in the vicinity of said beam.

15. The nanoelectromechanical system of claim 14, further comprising control circuitry, wherein said first charge member layer is provided a third charge and said control circuitry controls the magnitude of said third charge.

16. The nanoelectromechanical system of claim 14, further comprising a second charge member layer located in the vicinity of said beam, wherein said second charge member is provided a fourth charge by said control circuitry.

17. The nanoelectromechanical system of claim 16, wherein said control circuitry changes the polarities of said third and fourth charges at approximately the same time.

18. The nanoelectromechanical system of claim 1, further comprising sensing circuitry for determining the amount of current provided to said first rail during a period of time.

19. The nanoelectromechanical system of claim 18, wherein said sensing circuitry determines the amount of current provided to said second rail during said period of time.

20. The nanoelectromechanical system of claim 1, further comprising control circuitry for controlling the magnitude and direction of said electric field.

21. The nanoelectromechanical system of claim 1, further comprising:
a third pillar coupled to said substrate;
a fourth pillar coupled to said substrate;
a second nanometer-scale beam suspended between said third and fourth pillars, wherein slack is provided in said second beam between said third and fourth pillars;
a third rail located within the vicinity of said second beam, wherein said third rail is operable to contact said second beam; and
a fourth rail located within the vicinity of said nanometer-scale beam, wherein said fourth rail is operable to contact said second beam.

22. The nanoelectromechanical system of claim 21, wherein said first and third rails are electrically coupled together.

23. The nanoelectromechanical system of claim 21, wherein said electric field generator is operable to supply an electric field to said third rail, said fourth rail, and said second beam.

24. A nanoelectromechanical system comprising:
a substrate;
a first pillar coupled to said substrate;
a second pillar coupled to said substrate;
a nanometer-scale beam suspended between said first and second pillars, wherein slack is provided in said beam between said first and second pillars;
a first rail located within the vicinity of said beam, wherein said beam is operable to contact said first rail;
a second rail located within the vicinity of said beam, wherein said beam is operable to contact said second rail; and
an electric field generator for providing an electric field to said beam, wherein at least a portion of said first pillar comprises a piezoelectric material for adjusting the height of said first pillar.

25. A nanoelectromechanical system comprising:
a substrate,
a first pillar coupled to said substrate,
a second pillar coupled to said substrate;
a nanometer-scale beam suspended between said first and second pillars, wherein slack is provided in said beam between said first and second pillars;
a first rail located within the vicinity of said beam, wherein said beam is operable to contact said first rail;
a second rail located within the vicinity of said beam, wherein said beam is operable to contact said second rail; and
an electric field generator for providing an electric field to said beam, wherein said first pillar comprises:
a first metal layer;
a second metal layer; and
a layer of piezoelectric material coupled between said first and second metal layers.

26. A nanoelectromechanical system comprising:
a substrate,
a first pillar coupled to said substrate,
a second pillar coupled to said substrate;
a nanometer-scale beam suspended between said first and second pillars, wherein slack is provided in said beam between said first and second pillars;
a first rail located within the vicinity of said beam, wherein said beam is operable to contact said first rail;
a second rail located within the vicinity of said beam, wherein said beam is operable to contact said second rail; and
an electric field generator for providing an electric field to said beam, wherein:
said first pillar comprises a first piezoelectric material for adjusting the height of said first pillar; and
said second pillar comprises a second piezoelectric material for adjusting the height of said second pillar.

27. A nanoelectromechanical system comprising:
a substrate;
a nanometer-scale beam comprising:
a first portion coupled to said substrate;
a second portion coupled to said substrate;
a middle portion between said first and second portions, wherein slack is provided in said middle portion such that said middle portion is free-to-move;
a first rail, having a first charge, located within the vicinity of, and perpendicular to, said beam, wherein said beam is operable to contact said first rail; and
an electric field generator for providing an electric field to repel said beam away from said first rail when said beam contacts said first rail.

28. The nanoelectromechanical system of claim 27, further comprising control circuitry for providing said first charge to said first rail.

29. The nanoelectromechanical system of claim 28, wherein said control circuitry is operable to change the magnitude of said first charge.

30. The nanoelectromechanical system of claim 27, wherein a first pillar is coupled between said first portion and said substrate.

31. The nanoelectromechanical system of claim 27, wherein said first portion is connected to said substrate.

32. The nanoelectromechanical system of claim 27, further comprising a second rail located within the vicinity of said beam, wherein said beam is operable to contact said second rail.

33. The nanoelectromechanical system of claim 32, wherein said control circuitry provides a second charge to said second rail, wherein the polarities of said first and second charges are different.

34. The nanoelectromechanical system of claim 30, wherein at least a portion of said first pillar comprises a piezoelectric material for adjusting the height of said first pillar.

* * * * *